(12) United States Patent
Wei

(10) Patent No.: US 6,403,992 B1
(45) Date of Patent: Jun. 11, 2002

(54) COMPLEMENTARY METAL-OXIDE SEMICONDUCTOR DEVICE

(75) Inventor: Cheng-Ta Wei, Taoyuan (TW)

(73) Assignee: Integrated Technology Express Inc., Hsinchu (TW)

( * ) Notice: Subject to any disclaimer, the term of this patent is extended or adjusted under 35 U.S.C. 154(b) by 0 days.

(21) Appl. No.: 09/945,290

(22) Filed: Aug. 30, 2001

Related U.S. Application Data
(60) Provisional application No. 60/295,934, filed on Jun. 5, 2001.

(30) Foreign Application Priority Data
Aug. 1, 2001 (TW) .......................................... 90118735

(51) Int. Cl.$^7$ ............................................. H01L 27/10
(52) U.S. Cl. ........................ 257/204; 257/206; 257/357; 257/500
(58) Field of Search .......................... 257/69, 204, 206, 257/207, 208, 338, 350, 351, 357, 365, 368, 369, 371, 500

(56) References Cited
U.S. PATENT DOCUMENTS
| | | | | |
|---|---|---|---|---|
| 5,786,617 A | * | 7/1998 | Merrill et al. | 257/371 |
| 5,894,147 A | * | 4/1999 | Cacharelis | 257/316 |
| 6,143,594 A | * | 11/2000 | Tsao et al. | 257/342 |

* cited by examiner

*Primary Examiner*—Olik Chaudhuri
*Assistant Examiner*—Hoai Pham
(74) *Attorney, Agent, or Firm*—J.C. Patents

(57) ABSTRACT

A complementary metal-oxide semiconductor (CMOS) device, employing circuit conversion to achieve coexistent multiple voltage levels without body effect. The CMOS device, formed by a typical twin-well process, has a high voltage CMOS, a low voltage CMOS and a circuit converter. The circuit converter raises the operation voltage of the low voltage PMOS in the low voltage CMOS (in the N-type substrate) up to that of the high voltage PMOS in the high voltage CMOS. Alternatively, the circuit converter reduces the operation voltage of the low voltage NMOS in the low voltage CMOS to that of the high voltage NMOS in the high voltage CMOS. Thus, the body effect does not occur to the CMOS device.

14 Claims, 8 Drawing Sheets

COMPLEMENTARY METAL-OXIDE SEMICONDUCTOR DEVICE

CROSS-REFERENCE TO RELATED APPLICATION

This application claims the priority benefit of U.S.A. provisional application Ser. No. 60/295,934, filed on Jun. 5, 2001, all disclosures are incorporated therewith. This application also claims the priority of Taiwan application serial No. 90118735, filed Aug. 1, 2001.

BACKGROUND OF THE INVENTION

1. Field of the Invention

The invention relates in general to a complementary metal-oxide semiconductor (CMOS) device, and more particularly, to a CMOS device using circuit conversion to eliminate body effect and to obtain multiple voltage levels.

2. Description of the Related Art

In the prior art, CMOS devices, for example, CMOS devices having N-type substrates are fabricated by a twin-well high voltage fabrication process. As shown in FIG. 1, the N-type substrate of the high voltage PMOS 10 and N-type substrate of the low voltage PMOS 12 communicate with each other via the underlying N-type substrate. Consequently, the voltage level of the substrate (B4) of the low PMOS 12 is equal to that of the substrate (B2) of the high voltage PMOS 10. A serious body effect thus occurs to the low voltage PMOS 12. As the substrate voltage level of the low voltage PMOS 12 increases, the reverse bias from the source (S4) of the low voltage PMOS 12 to the substrate (B4) is increased to cause an increase of the threshold voltage of the low voltage PMOS 12. When the input operation voltage is a low voltage, the low voltage PMOS 12 cannot operate normally. FIG. 2 shows a CMOS device with a P-type substrate. Since the P-wells of the high voltage NMOS 24 and the low voltage NMOS 26 conduct via the underlying P-type substrate, the substrate (B3 and B1) voltage levels of the low voltage NMOS 26 and the high voltage NMOS 24 are the same. A serious body effect is caused. As the substrate (B3) voltage level of the low voltage NMOS 26 decreases, the reverse bias from the source (S3) of the low voltage NMOS 26 to the substrate (B3) increases to cause an increase in threshold voltage of the low voltage NMOS 26. When the input voltage is a high voltage, the low voltage NMOS 26 cannot function properly.

A conventional method for a CMOS device to obtain multiple voltage levels with the elimination of substrate effect is introduced here. In FIG. 3, a CMOS device with an N-type substrate is illustrated. An additional P-well 382 is added in the low voltage CMOS area of the CMOS device, so that the problem caused by conductance between the N-wells is resolved. The body effect is thus eliminated and the low voltage PMOS 32 can function normally. FIG. 4 illustrates a CMOS device with a P-type substrate. Similarly, an additional N-well 484 is added in the low voltage CMOS area of the CMOS device so that the problem caused by communication between the P-wells is resolved. The body effect is thus eliminated; the low voltage NMOS 46 can operate normally.

The prior art has the following drawbacks:

1. Since an additional P-well 382 (N-well 484) is required for the CMOS with the N-type (P-type) substrate to overcome the problem of the communication between the N-wells (P-well), the difficulty in fabrication is increased.

2. As the fabrication becomes more complex, the fabrication cost is raised.

SUMMARY OF THE INVENTION

The invention provides a CMOS device applying circuit conversion to eliminate the body effect to obtain multiple voltage levels. Since the circuit conversion is applied to eliminate the body effect, the fabrication process only requires a typical twin-well high voltage process without increasing the fabrication cost.

The invention provides a method to eliminate the body effect to obtain multiple voltage levels of a CMOS device. A typical twin-well fabrication process is used. The CMOS device comprises a high voltage CMOS and a low voltage CMOS. The high voltage CMOS further includes a high voltage PMOS and a high voltage NMOS. The high voltage PMOS has a source and a substrate connected to a positive voltage source, and an N-well. The high voltage NMOS has a source and a substrate connected to a negative voltage source, and a P-well. The low voltage CMOS further comprises a low voltage PMOS and a low voltage NMOS. The low voltage PMOS has a substrate, a source and a substrate connected to a positive voltage source lower than that of the high voltage PMOS. The low voltage NMOS has a substrate, a source and a substrate connected to a positive voltage source lower than that of the high voltage NMOS. A substrate such as a common substrate for the high voltage CMOS and the low voltage CMOS is further included in the CMOS device. The substrate includes a P-type substrate or an N-type substrate. The CMOS device further comprises a circuit converter to raise the voltage level of the low voltage PMOS in the low voltage CMOS up to the operation voltage of the high voltage PMOS in the high voltage CMOS. Alternatively, the operation voltage level of the low voltage NMOS in the low voltage CMOS is reduced to the operation voltage of the high voltage NMOS in the high voltage CMOS.

In one embodiment of the invention, if the CMOS device has an N-type substrate, the source operation voltage of the low voltage PMOS in the low voltage CMOS is raised up to the source operation voltage of the high voltage PMOS in the high voltage CMOS via a first level shifter in the circuit converter. The voltage via the first level shifter is called the first level shifted output voltage. Secondly, the source operation voltage of the low voltage NMOS in the low voltage CMOS, is raised to a voltage with the original input voltage of the low voltage CMOS less than the first level shifter output voltage (that is, a difference between the input maximum voltage and the input minimum voltage). The output voltage of the charge pump is called the charge pump output voltage. Via the voltage clamp circuit of the circuit converter, the first shifter output voltage is referred as the maximum voltage level of the input voltage for the low voltage CMOS, and the charge pump output voltage is the minimum level of the input voltage for the low voltage CMOS. When the input voltage reaches the maximum level, the low voltage NMOS in the low voltage CMOS conducts. Meanwhile, the minimum levels of the output voltage and the input voltage are the same. When the input voltage reaches the minimum level, the low voltage PMOS in the low voltage CMOS conducts. Meanwhile, the low voltage PMOS in the low voltage CMOS conducts and the maximum levels of the output voltage and input voltage are the same. Via the second level shifter in the circuit converter, the maximum level and the minimum level of the output voltage are reduced to the original maximum and minimum levels of the output voltage for the low CMOS.

In another embodiment of the invention, the CMOS device has a P-type substrate. The source operation voltage of the low voltage NMOS in the low voltage CMOS is raised up to the source operation voltage of the high voltage NMOS in the high voltage CMOS via a first level shifter in the circuit converter. The voltage via the first level shifter is called the first level shifted output voltage. Secondly, the source operation voltage of the low voltage PMOS in the low voltage CMOS, is raised to a voltage with the original input voltage of the low voltage CMOS less than the first level shifter output voltage (that is, a difference between the input maximum voltage and the input minimum voltage). The output voltage of the charge pump is called the charge pump output voltage. Via the voltage clamp circuit of the circuit converter, the first shifter output voltage is referred as the minimum voltage level of the input voltage for the low voltage CMOS, and the charge pump output voltage is the maximum level of the input voltage for the low voltage CMOS. When the input voltage reaches the maximum level, the low voltage NMOS in the low voltage CMOS conducts. Meanwhile, the minimum levels of the output voltage and the input voltage are the same. When the input voltage reaches the minimum level, the low voltage PMOS in the low voltage CMOS conducts, and the maximum levels of the output voltage and input voltage are the same. Via the second level shifter in the circuit converter the maximum level and the minimum level of the output voltage are reduced to the original maximum and minimum levels of the output voltage for the low CMOS.

According to the above, by applying the circuit converter, the invention uses the typical twin-well fabrication process to form a circuit converter to obtain a CMOS device with multiple voltage levels, of which the body effect is eliminated. The problem introduced by forming an additional well in the conventional method is resolved.

Both the foregoing general description and the following detailed description are exemplary and explanatory only and are not restrictive of the invention, as claimed.

DESCRIPTION OF THE PREFERRED EMBODIMENTS

Figure 1:
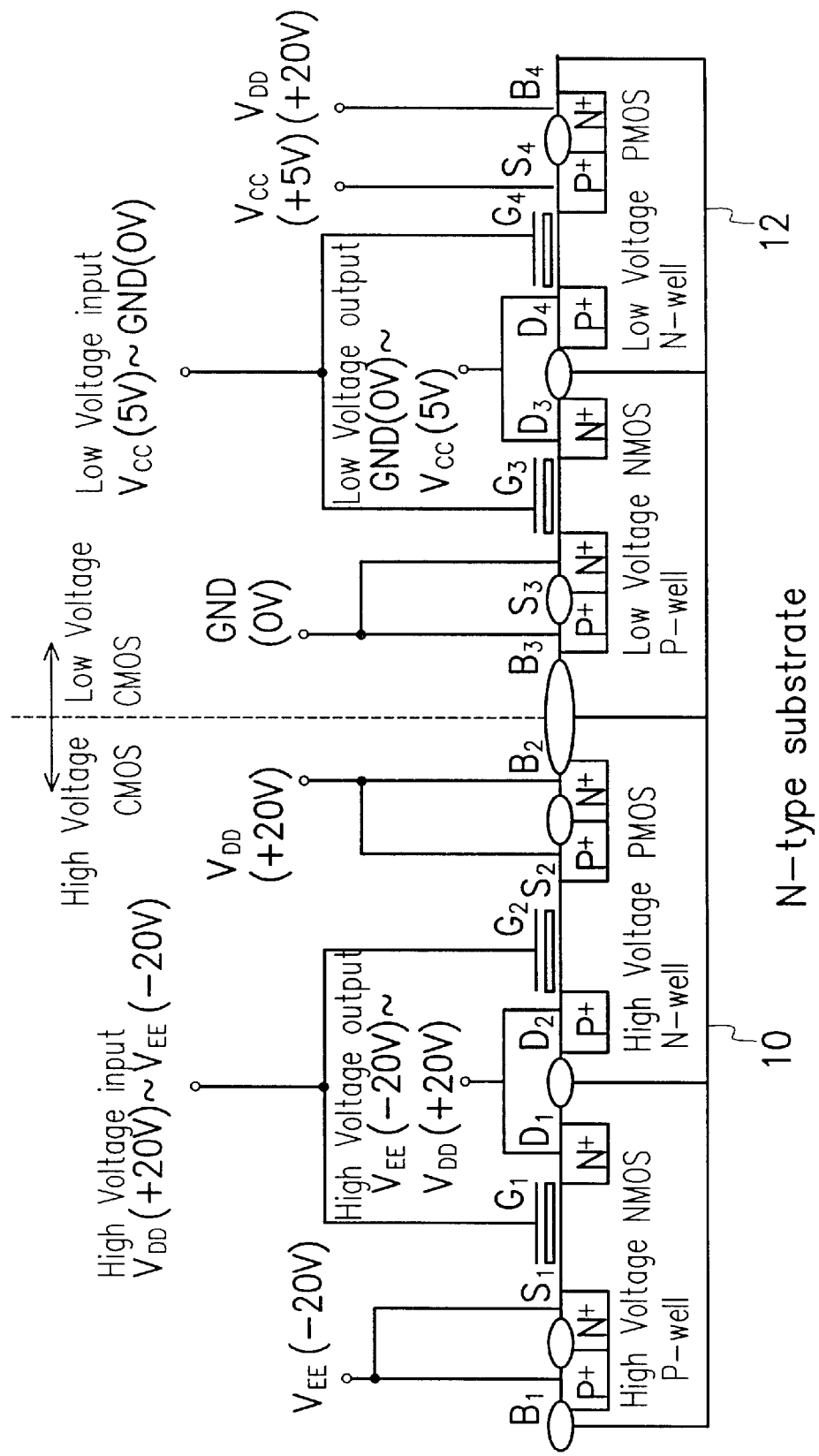
FIG. 1 shows a schematic, cross-sectional view of a CMOS device with an N-type substrate formed by a conventional twin-well high voltage process.
Figure 2:
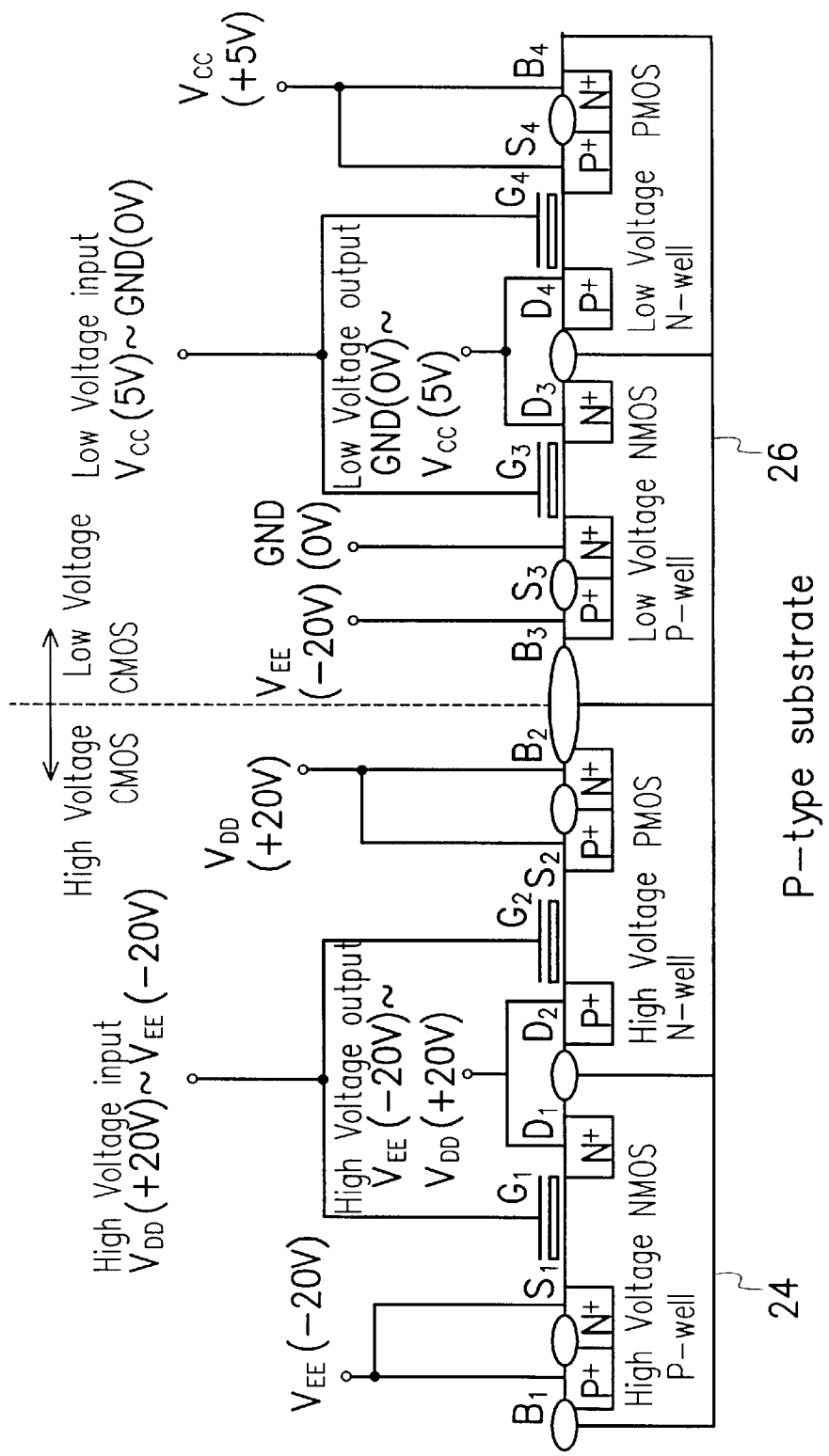
FIG. 2 shows a schematic, cross-sectional view of a CMOS device with a P-type substrate formed by a conventional twin-well high voltage process.
Figure 3:
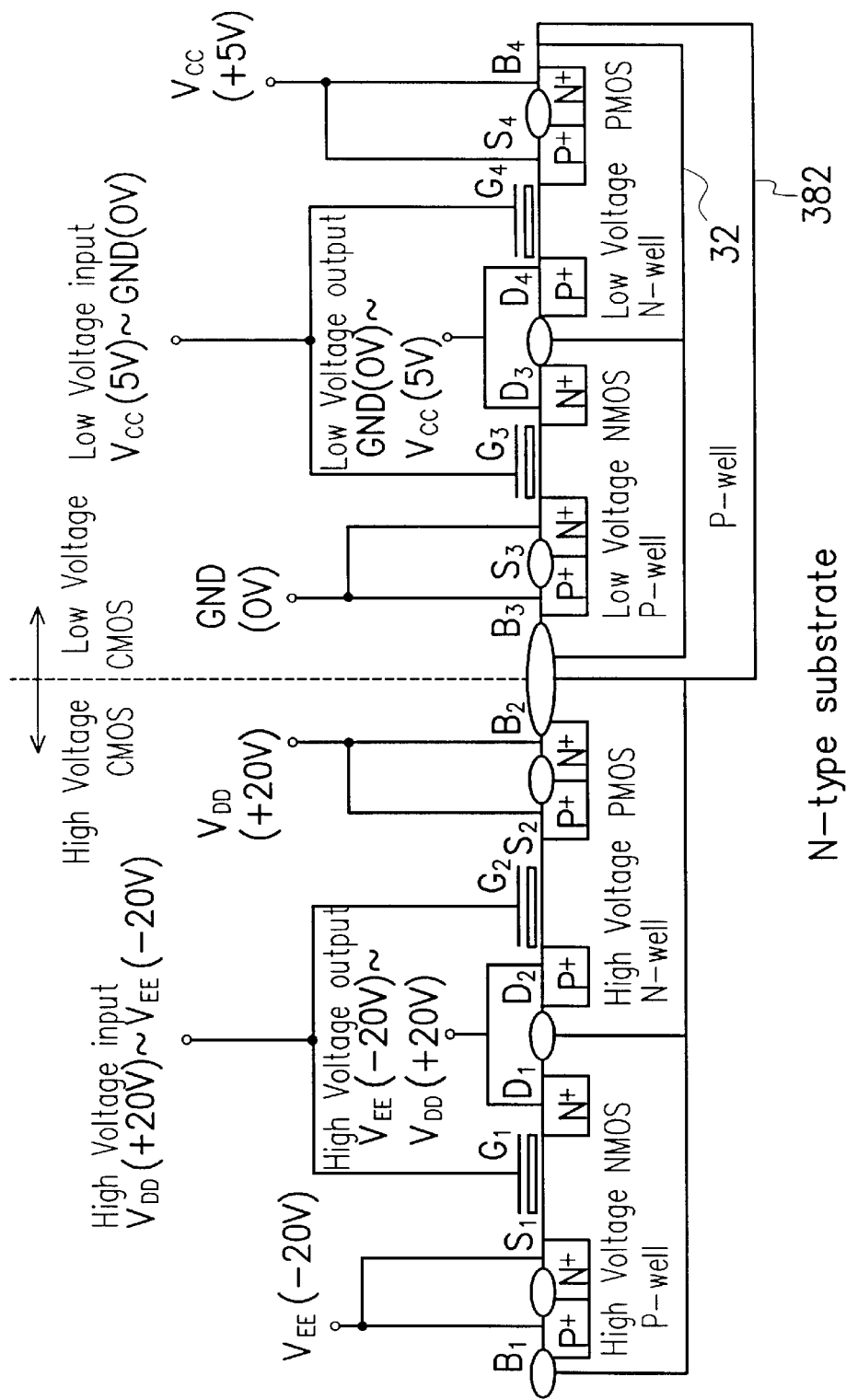
FIG. 3 is a schematic, cross-sectional view showing a conventional CMOS device with an N-type substrate, of which the body effect is eliminated and multiple voltage levels co-exist.
Figure 4:
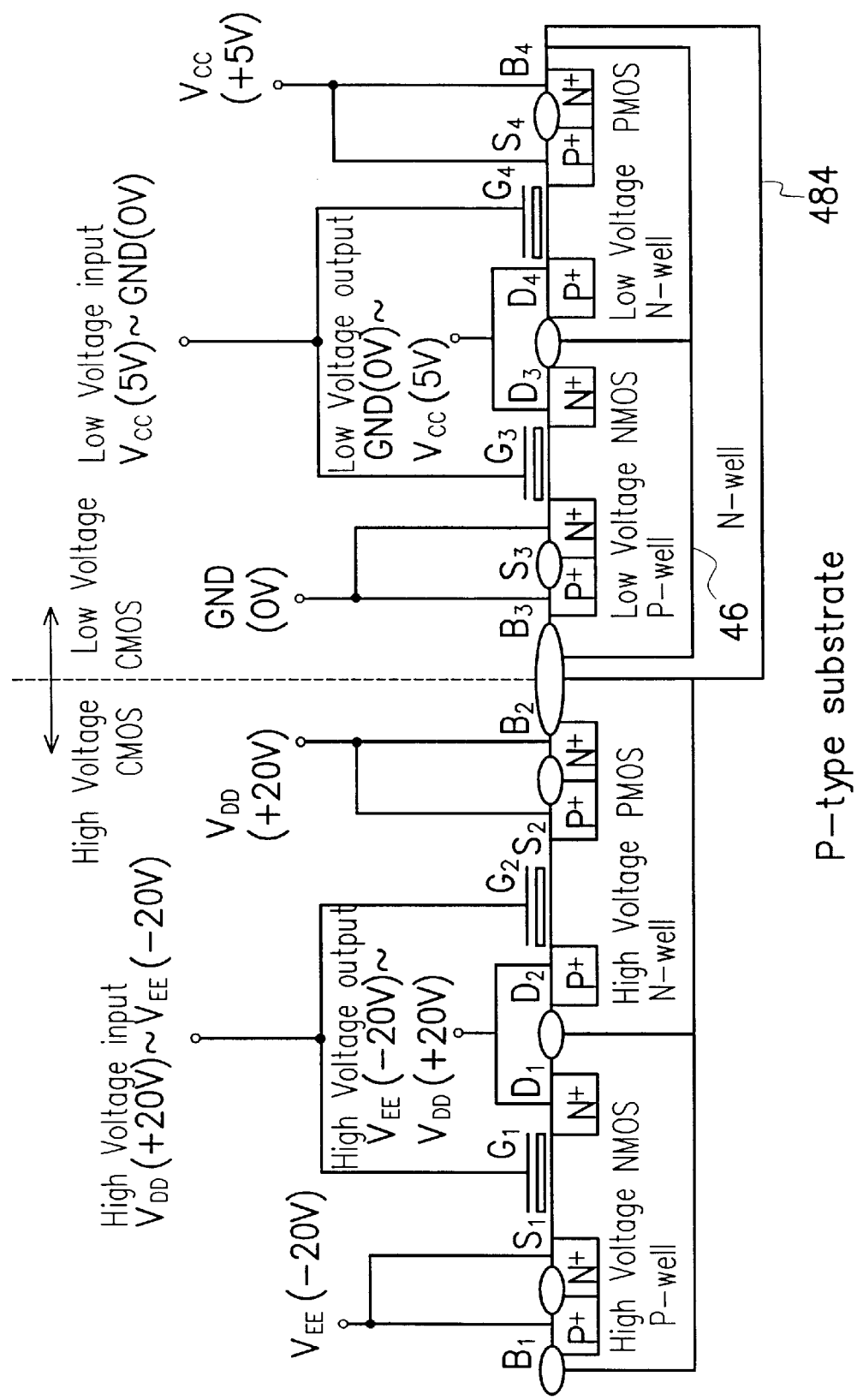
FIG. 4 is a schematic, cross-sectional view showing a conventional CMOS device with a P-type substrate, in which the body effect is eliminated and multiple voltage levels co-exist.
Figure 5:
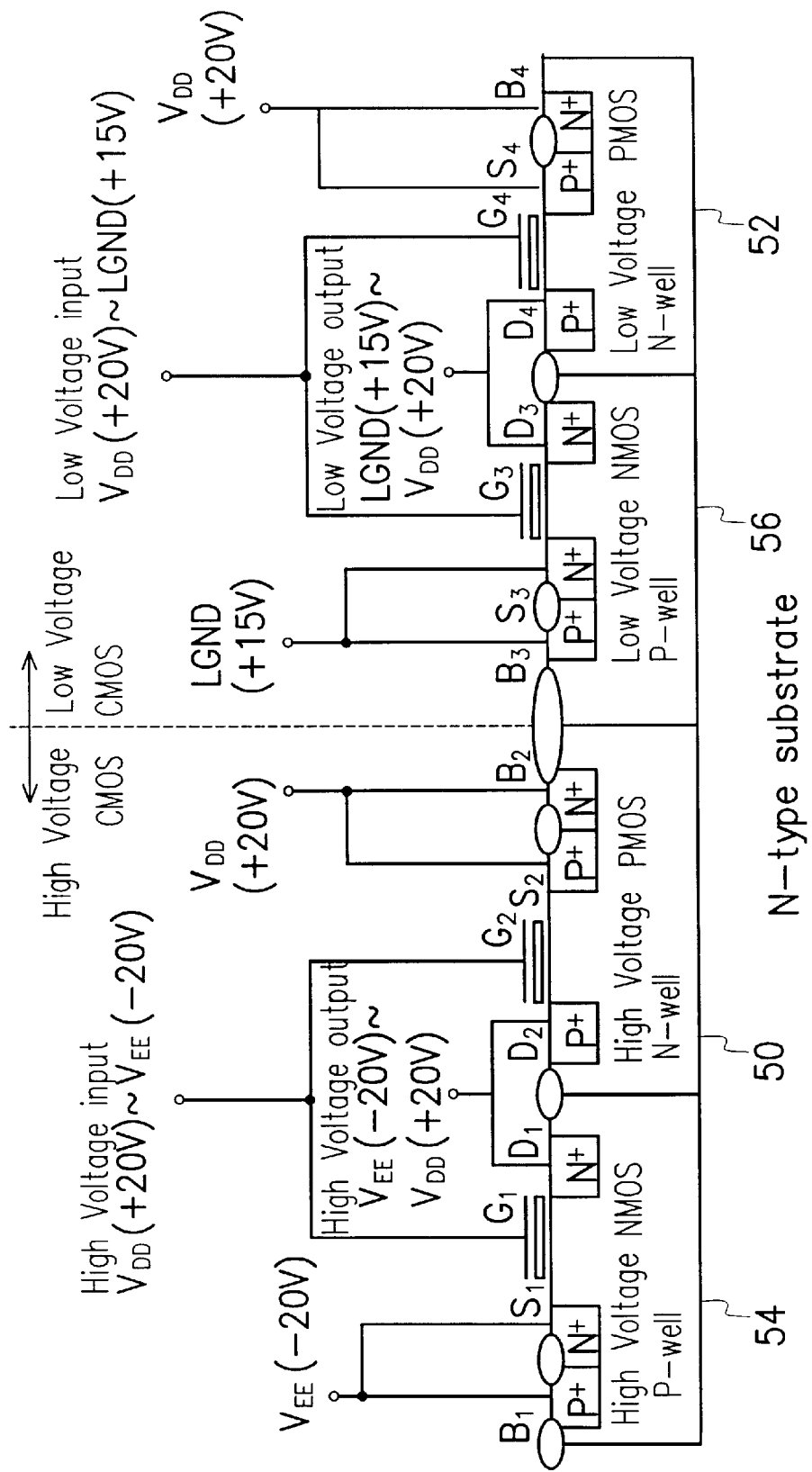
FIG. 5 shows a schematic, cross-sectional view of a CMOS device with an N-type substrate using the circuit conversion to achieve co-existence of multiple voltage levels with the elimination of body effect according to the invention.

The invention employs a circuit conversion method to achieve multiple voltage levels for a CMOS device with the elimination of body effect. A schematic, cross-sectional view of such a CMOS device with an N-type substrate is illustrated in FIG. 5. The CMOS device comprises a high voltage CMOS, a low voltage CMOS, an N-type substrate and a circuit converter.

The high voltage CMOS includes a high voltage PMOS 50 and a high voltage NMOS 54. The operation voltage of a source (S2) and a substrate (B2) of the high voltage PMOS 50 is VDD (+20V). The operation voltage of a source (S1) and a substrate (B1) of the high voltage NMOS 54 is VEE (−20V). The high voltage CMOS has an input voltage (that is, the gate (G2) voltage of the high voltage PMOS 50 and the gate (G1) voltage of the high voltage NMOS 54) with a maximum value of VDD (+20V) and a minimum value of VEE (−20V). When the input voltage is VDD (+20V), the high voltage NMOS 54 conducts while the high voltage PMOS is cut off. Meanwhile, the output voltage (that is, the drain (D1) voltage of the high voltage NMOS 54) is VEE (−20V). When the input voltage is VEE (−20V), the high voltage PMOS 50 conducts and the high voltage NMOS 54 is cut off. Meanwhile, the output voltage of the high voltage CMOS (that is, the drain (D2) voltage of the high voltage PMOS) is VDD (+20V).

The low voltage CMOS includes a low voltage PMOS 52 and a high voltage NMOS 56. The operation voltage of a source (S4) and a substrate (B4) of the low voltage PMOS 52 is VCC (+5V). The operation voltage of a source (S3) and a substrate (B3) of the low voltage NMOS 56 is GND (0V). The low voltage CMOS has an input voltage (that is, the gate (G3) voltage of the low voltage NMOS 56 and the gate (G4) voltage of the low voltage PMOS 52) with a maximum value of VCC (+5V) and a minimum value of GND (0V). When CMOS device has an N-type substrate, the N-wells of the low voltage PMOS 52 and the high voltage PMOS 50 conduct with each other via the N-type substrate. The substrate (B4) voltage of low voltage PMOS 52 is raised from VCC (+5V) to VDD (+20V) to generate the body effect. As the reverse bias across the low voltage PMOS 52 is increased, the threshold voltage of the low voltage PMOS 52 is increased. When the input voltage is VCC (+5V), the low voltage NMOS 56 conducts while the low voltage PMOS 52 is cut off. Meanwhile, the output voltage of the low voltage CMOS (that is, the drain (D3) voltage of the low voltage NMOS 56) is GND (0V). When the input voltage is GND (0V), both the low voltage PMOS 52 and PMOS 56 are cut off. The CMOS device cannot operate properly.

Figure 6:
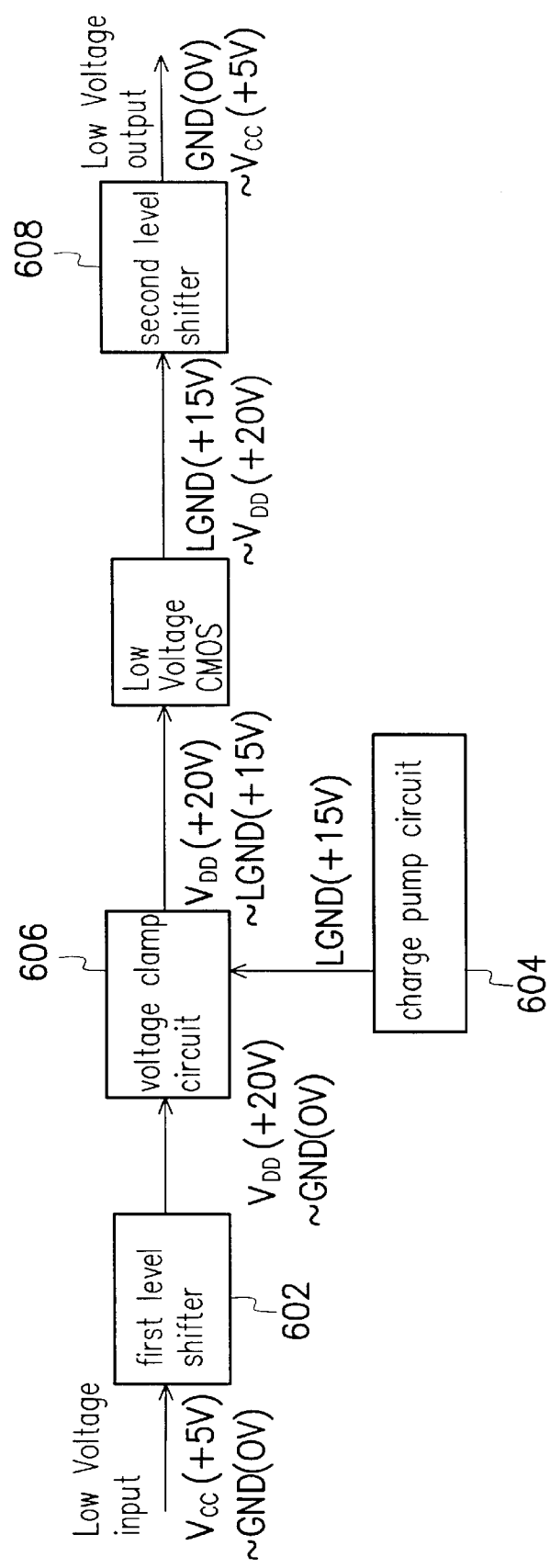
FIG. 6 shows a circuit diagram for a CMOS device with an N-type substrate using the circuit conversion to achieve co-existence of multiple voltage levels with the elimination of body effect according to the invention.

To resolve the above problem, the invention uses a circuit conversion method to eliminate the substrate, so as to obtain multiple voltage levels. One embodiment is illustrated in FIG. 6, in which the circuit converter is shown.

The source (S4) operation voltage of the low voltage PMOS 52 of the low voltage CMOS is set at VCC (+5V). Via a first level shifter 602 in the circuit converter, the source (S4) operation voltage is raised up to be the same as the substrate (B4) voltage of the low voltage PMOS 52. The body effect is thus eliminated from the low voltage PMOS 52. Since the threshold voltage of the low voltage PMOS 52 is not changed, the voltage output from the first level shifter 602 is called the first level shifter output voltage VDD (+20V). The source (S3) operation voltage of the low voltage NMOS 56 of the low voltage CMOS is set at GND (0V). Through the charge pump circuit in the circuit converter, the source operation voltage is raised to a voltage with an original input voltage (5V) less than the first level shifter output voltage VDD (20V). Such voltage is called LGND with a value of 15V. The voltage output from the charge pump circuit 604 is called the charge pump output voltage LGND (+15V). Through the voltage clamp circuit 606, the first level shifter output voltage VDD (+20V) is referred as the maximum level of the input voltage for the low voltage CMOS, while the charge pump output voltage LGND (+15V) is referred as the minimum level of the input voltage for the low voltage CMOS. When the input voltage reaches the maximum level VDD (+20V), the low voltage NMOS 56 of the low voltage CMOS conducts, and the low voltage PMOS 52 is cut off. Meanwhile, the minimum levels LGND of the output voltage and the input voltage are the same (+15V). When the input voltage reaches the minimum level LGND (+15V), the low voltage PMOS 52 of the low voltage PMOS 52 conducts, and the low voltage NMOS 56 is cut off. Meanwhile, the output voltage (that is, the drain (D4) voltage of the low voltage PMOS 52) is the same as the maximum level VDD (+20V). Through a second level shifter 608 of the circuit converter, the maximum level VDD (+20V) and the minimum level LGND (+15V) of the output voltage are dropped to the same as the original maximum voltage VCC (+5V) and the original minimum voltage GND (0V) of the output voltage for the low voltage CMOS.

Figure 7:
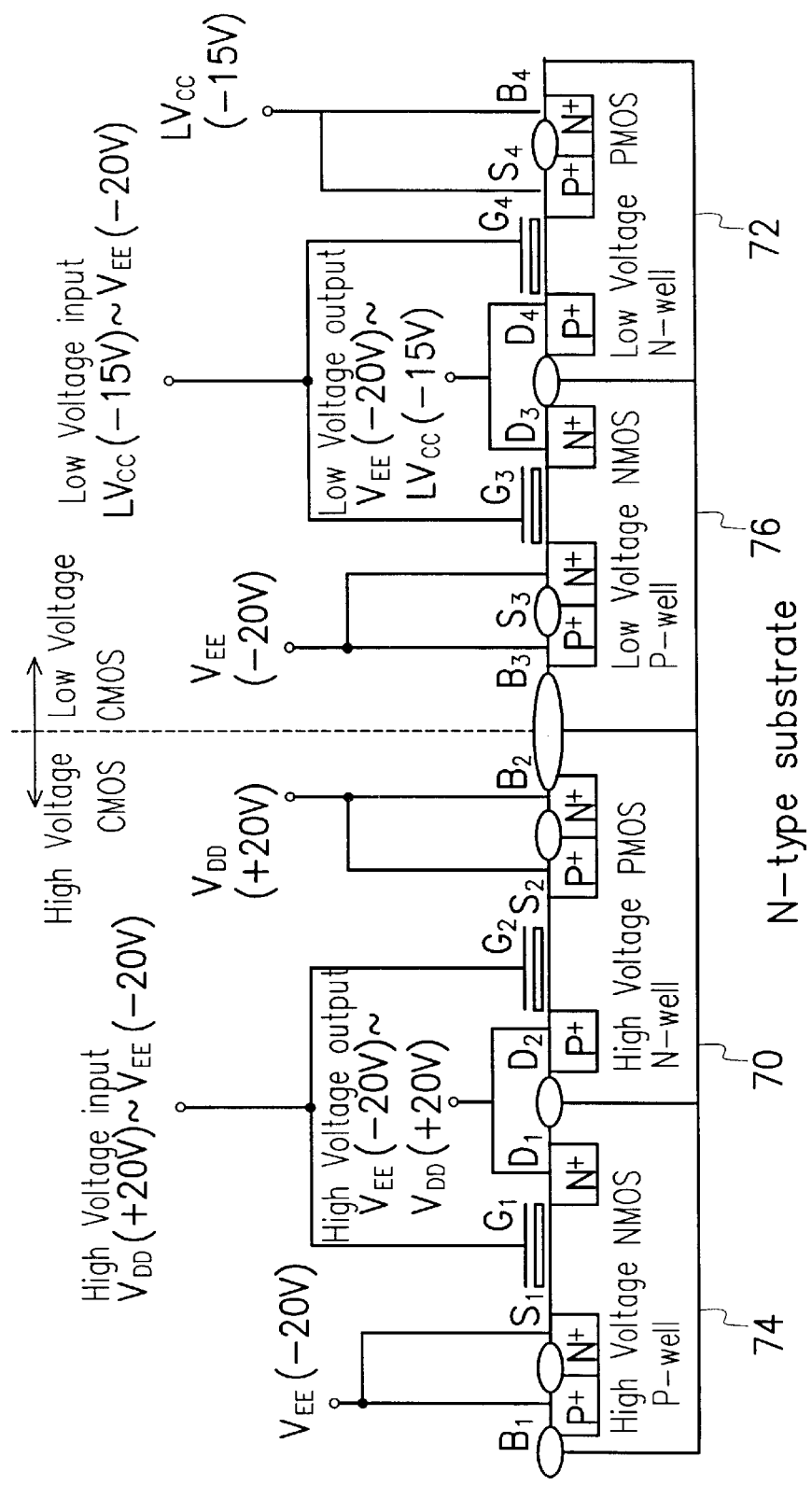
FIG. 7 shows a schematic, cross-sectional view of a CMOS device with a P-type substrate using the circuit conversion to achieve co-existence of multiple voltage levels with the elimination of body effect according to the invention.

FIG. 7 shows a schematic, cross-sectional view of such CMOS device with a P-type substrate with multiple voltage levels while the body effect is eliminated. The CMOS device comprises a high voltage CMOS, a low voltage CMOS, a P-type substrate and a circuit converter.

The high voltage CMOS includes a high voltage PMOS 70 and a high voltage NMOS 74. The operation voltage of a source (S2) and a substrate (B2) of the high voltage PMOS 70 is VDD (+20V). The operation voltage of a source (S1) and a substrate (B1) of the high voltage NMOS 74 is VEE (−20V). The high voltage CMOS has an input voltage (that is, the gate (G2) voltage of the high voltage PMOS 70 and the gate (G1) voltage of the high voltage NMOS 74) with a maximum value of VDD (+20V) and a minimum value of VEE (−20V). When the input voltage is VDD (+20V), the high voltage NMOS 74 conducts while the high voltage PMOS 70 is cut off. Meanwhile, the output voltage (that is, the drain (D1) voltage of the high voltage NMOS 74) is VEE (−20V). When the input voltage is VEE (−20V), the high voltage PMOS 70 conducts and the high voltage NMOS 74 is cut off. Meanwhile, the output voltage of the high voltage CMOS (that is, the drain (D2) voltage of the high voltage PMOS 70) is VDD (+20V).

The low voltage CMOS includes a low voltage PMOS 72 and a high voltage NMOS 76. The operation voltage of a source (S4) and a substrate (B4) of the low voltage PMOS 72 is VCC (+5V). The operation voltage of a source (S3) and a substrate (B3) of the low voltage NMOS 76 is GND (0V). The low voltage CMOS has an input voltage (that is, the gate (G3) voltage of the low voltage NMOS 76 and the gate (G4) voltage of the low voltage PMOS 72) with a maximum value of VCC (+5V) and a minimum value of GND (0V). When CMOS device has a P-type substrate, the P-wells of the low voltage PMOS 76 and the high voltage PMOS 74 conduct with each other via the P-type substrate. The substrate voltage of low voltage PMOS 76 is dropped from GND (0V) to VEE (+5V) to generate the body effect. As the reverse bias across the low voltage PMOS 76 is increased, the threshold voltage of the low voltage PMOS 76 is increased. When the input voltage is VCC (+5V), the low voltage NMOS 76 is cut off, and the low voltage PMOS 72 is also cut off. The CMOS device cannot function normally. When the input voltage is GND (0V), low voltage PMOS 72 conducts, while the PMOS 76 is cut off. The output voltage of the high voltage CMOS (that is, the drain (D3) voltage of the low voltage 76) is VCC (+5V).

Figure 8:
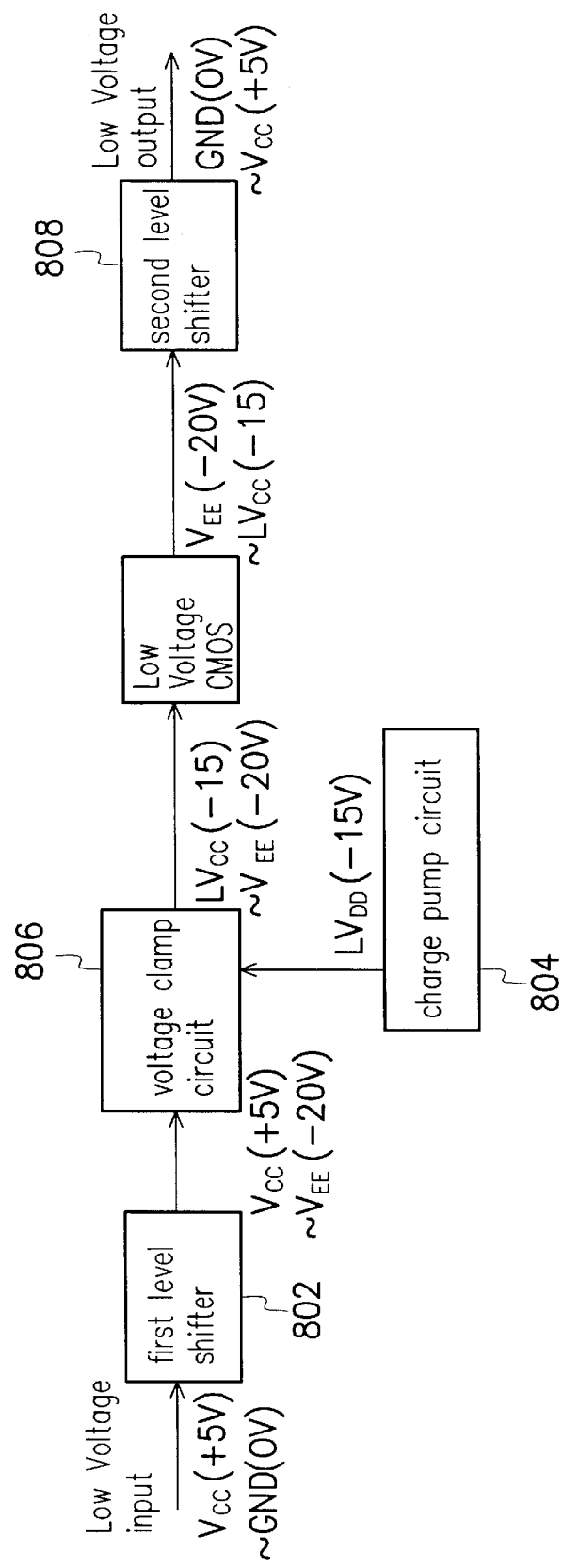
FIG. 8 shows the circuit diagram for a CMOS device with a P-type substrate using the circuit conversion to achieve co-existence of multiple voltage levels with the elimination of body effect according to the invention

To resolve the above problem, the invention uses a circuit conversion method to eliminate the substrate, so as to obtain multiple voltage levels. One embodiment is illustrated in FIG. 8, of which the circuit converter is shown.

The source (S4) operation voltage of the low voltage PMOS 76 of the low voltage NMOS is set at GND (0V). Via a first level shifter 802 in the circuit converter, the source (S3) operation voltage is dropped to be the same as the substrate (B4) voltage of VEE (−20V). The body effect is thus eliminated from the low voltage PMOS 76. The threshold voltage of the low voltage PMOS 76 is not changed, and the voltage output from the first level shifter 802 is called the first level shifter output voltage VEE (−20V). The source (S3) operation voltage of the low voltage PMOS 72 of the low voltage CMOS is set at VCC (+5V). Through the charge pump circuit 804 in the circuit converter, the source (S4) operation voltage is dropped to a voltage with an original input voltage (5V) of the low voltage CMOS higher than the first level shifter output voltage VEE (−20V). Such voltage is called LVCC with a value of −15V. The voltage output from the charge pump circuit 804 is called the charge pump output voltage LVCC (−15V). Through the voltage clamp circuit 806, the first level shifter output voltage VEE (−20V) is referred as the minimum level of the input voltage for the low voltage CMOS, while the charge pump output voltage LVCC (−15V) is referred as the maximum level of the input voltage for the low voltage CMOS. When the input voltage reaches the maximum level LVCC (−15V), the low voltage NMOS 76 of the low voltage CMOS conducts, and the low voltage PMOS 72 is cut off. Meanwhile, the minimum levels VEE of the output voltage (that is, the drain (D3) voltage of the low voltage PMOS 72) and the input voltage are the same (−20V). When the input voltage reaches the minimum level VEE (−20V), the low voltage PMOS 72 of the low voltage CMOS conducts and the low voltage NMOS 76 is cut off. Meanwhile, the maximum levels of the output voltage and the input voltage are the same as LVCC (−15V). Through a second level shifter 808 of the circuit converter, the maximum level LVCC (−15V) and the minimum level VEE (−20V) of the output voltage are raised to the same as the original maximum voltage VCC (+5V) and the original minimum voltage GND (0V) of the output voltage for the low voltage CMOS.

According to the above, the invention has the following advantages:

1. The invention adapts a circuit converter to obtain multiple voltage levels of the CMOS device fabricated by the conventional twin-well process. In addition, the body effect is eliminated.

2. Since only a typical twin-well process is required, no additional cost is incurred.

Other embodiments of the invention will appear to those skilled in the art from consideration of the specification and practice of the invention disclosed herein. It is intended that the specification and examples be considered as exemplary only, with a true scope and spirit of the invention being indicated by the following claims.

What is claimed is:

1. A complementary metal-oxide semiconductor (CMOS) device with an N-type substrate, comprising:
   a high voltage CMOS, which includes a high voltage PMOS and a high voltage NMOS, wherein the high voltage PMOS has a source and a substrate connected to a positive voltage source, and an N-well, and the high NMOS has a source and a substrate connected to a negative voltage source, and a P-well;
   a low voltage CMOS, which includes a low voltage PMOS and a low voltage NMOS, wherein the low voltage PMOS has a source and a substrate connected to a positive voltage source lower than the positive voltage source connected to the source of the high voltage PMOS, and an N-well, and the low voltage NMOS has a source and a substrate connected to a negative voltage source higher than that connected to the source of the high voltage NMOS, and a P-well;
   a substrate, wherein the substrate is a common substrate shared by the high voltage CMOS and the low voltage CMOS; and
   a circuit converter, to raise an operation voltage of the low voltage PMOS in the low voltage CMOS up to the same as that of the high voltage PMOS in the high voltage CMOS.

2. The CMOS device according to claim 1, wherein the circuit converter further comprises:
   a first level shifter, to raise a source operation voltage of the low voltage PMOS in the low voltage CMOS to that of the high voltage PMOS in the high voltage CMOS, wherein a voltage output from the first level shifter is called the first level shifter output voltage;
   a charge pump circuit, to raise a source operation voltage of the low voltage NMOS of the low voltage CMOS to a voltage with an original input voltage of the low voltage CMOS less than the first level shifter output voltage, that is, a difference between a maximum level and a minimum level, wherein an voltage output from the charge pump circuit is called a charge pump circuit output voltage;
   a voltage clamp circuit, to set the first level shifter output voltage as the maximum level of the input voltage of the low voltage CMOS, and the charge pump circuit output voltage as the minimum level of the input voltage of the low voltage CMOS;
   a low voltage CMOS, with the maximum level and the minimum level of the voltage clamp circuit output voltage as the maximum level and minimum level of the input voltage for the low voltage CMOS, wherein when the input voltage reaches the maximum level, the low voltage NMOS in the low voltage CMOS conducts, and the output voltage and the input voltage have identical minimum levels, when the input voltage reaches the minimum level, the low voltage PMOS in the low voltage CMOS conducts, and the output voltage and the input voltage have identical maximum levels; and
   a second level shifter, to reduce the maximum level and the minimum of the output voltage to the original maximum level and the original minimum level of the output voltage for the low voltage CMOS.

3. The CMOS device according to claim 2, wherein the first level shifter is coupled to the voltage clamp circuit to perform a voltage conversion on the original maximum level for the operation voltage of the low voltage CMOS.

4. The CMOS device according to claim 2, wherein the charge pump circuit is coupled to the voltage clamp circuit to perform a voltage conversion on the original minimum level for the operation voltage of the low voltage CMOS.

5. The CMOS device according to claim 2, wherein the voltage clamp circuit is coupled to the low voltage CMOS to refer the voltage converted maximum level and minimum level as the maximum level and the minimum level of the input voltage.

6. The CMOS device according to claim 2, wherein the low voltage CMOS is coupled to the second level shifter to refer the maximum level and the minimum level of the input voltage as the maximum level and the minimum level of the output voltage.

7. The CMOS device according to claim 2, wherein the second level shifter reduces the maximum level and the minimum level of the output voltage for the low voltage CMOS to the original maximum level and the original minimum level.

8. A complementary metal-oxide semiconductor (CMOS) device with a P-type substrate, comprising:
   a high voltage CMOS, which includes a high voltage PMOS and a high voltage NMOS, wherein the high voltage PMOS has a source and a substrate connected to a positive voltage source, and an N-well, and the high NMOS has a source and a substrate connected to a negative voltage source, and a P-well;
   a low voltage CMOS, which includes a low voltage PMOS and a low voltage NMOS, wherein the low voltage PMOS has a source and a substrate connected to a positive voltage source lower than the positive voltage source connected to the source of the high voltage PMOS, and an N-well, and the low voltage NMOS has a source and a substrate connected to a negative voltage source higher than that connected to the source of the high voltage NMOS, and a P-well;
   a substrate, wherein the substrate is a common substrate shared by the high voltage CMOS and the low voltage CMOS; and
   a circuit converter, to reduce an operation voltage of the low voltage NMOS in the low voltage CMOS to that of the high voltage NMOS in the high voltage CMOS to prevent a body effect.

9. The CMOS device according to claim 8, wherein the circuit converter further comprises:
   a first level shifter, to reduce a source operation voltage of the low voltage NMOS in the low voltage CMOS to the same as that of the high voltage NMOS in the high voltage CMOS, wherein a voltage output from the first level shifter is called the first level shifter output voltage;
   a charge pump circuit, to reduce a source operation voltage of the low voltage PMOS of the low voltage CMOS to a voltage with an original input voltage of the low voltage CMOS higher than the first level shifter output voltage, that is, a difference between a maximum level and a minimum level, wherein an voltage output from the charge pump circuit is called a charge pump circuit output voltage;
   a voltage clamp circuit, to set the first level shifter output voltage as the minimum level of the input voltage of the low voltage CMOS, wherein the charge pump circuit output voltage is the maximum level of the input voltage of the low voltage CMOS;

a low voltage CMOS, with the maximum level and the minimum level of the voltage clamp circuit output voltage being the maximum level and minimum level of the input voltage for the low voltage CMOS, wherein when the input voltage reaches the maximum level, the low voltage NMOS in the low voltage CMOS conducts, and the output voltage and the input voltage have the same minimum levels, when the input voltage reaches the minimum level, the low voltage PMOS in the low voltage CMOS conducts, and the output voltage and the input voltage have the same maximum levels; and a second level shifter, to reduce the maximum level and the minimum level of the output voltage to the original maximum level and the original minimum level of the output voltage for the low voltage CMOS.

10. The CMOS device according to claim 9, wherein the first level shifter is coupled to the voltage clamp circuit to perform a voltage conversion on the original maximum level for the operation voltage of the low voltage CMOS.

11. The CMOS device according to claim 9, wherein the charge pump circuit is coupled to the voltage clamp circuit to perform a voltage conversion on the original minimum level for the operation voltage of the low voltage CMOS.

12. The CMOS device according to claim 9, wherein the voltage clamp circuit is coupled to the low voltage CMOS to refer the voltage converted maximum level and minimum level as the maximum level and the minimum level of the input voltage.

13. The CMOS device according to claim 9, wherein the low voltage CMOS is coupled to the second level shifter to refer the maximum level and the minimum level of the input voltage as the maximum level and the minimum level of the output voltage.

14. The CMOS device according to claim 9, wherein the second level shifter reduces the maximum level and the minimum level of the output voltage for the low voltage CMOS to the original maximum level and the original minimum level.

* * * * *